US006430737B1

(12) United States Patent
Cobb et al.

(10) Patent No.: US 6,430,737 B1
(45) Date of Patent: Aug. 6, 2002

(54) CONVERGENCE TECHNIQUE FOR MODEL-BASED OPTICAL AND PROCESS CORRECTION

(75) Inventors: Nicolas Bailey Cobb; Emile Sahouria, both of San Jose, CA (US)

(73) Assignee: Mentor Graphics Corp., Wilsonville, OR (US)

( * ) Notice: Subject to any disclaimer, the term of this patent is extended or adjusted under 35 U.S.C. 154(b) by 0 days.

(21) Appl. No.: 09/613,214

(22) Filed: Jul. 10, 2000

(51) Int. Cl.[7] .............................................. G06F 17/50

(52) U.S. Cl. ........................................................ 716/19

(58) Field of Search ....................................... 716/1–21

(56) References Cited

U.S. PATENT DOCUMENTS 5,655,110 A * 8/1997 Krivokapic .................. 716/19
6,120,952 A 9/2000 Pierrat et al. ................. 430/30
6,187,483 B1 2/2001 Capodieci et al. ............ 716/20
6,249,904 B1 6/2001 Cobb

OTHER PUBLICATIONS

Cobb, et al., "Improved Method and Apparatus for Submicron IC Design Using Edge Fragment Tagging", Application for United States Patent, filed: Apr. 30, 1999, Serial No.: 09/302,700.

* cited by examiner

*Primary Examiner*—Matthew Smith
*Assistant Examiner*—Thuan Do
(74) *Attorney, Agent, or Firm*—Blakely Sokoloff Taylor & Zafmann LLP

(57) ABSTRACT

Layout correction is accomplished using a forward mapping technique. Forward mapping refers to mapping of fragments from a reticle layout to a target layout, while backward mapping refers to mapping of fragments from the target layout to the reticle layout. Forward mapping provides a technique for making an unambiguous mapping for each reticle fragment to a corresponding target layout fragment. The mapping does not necessarily provide a one-to-one correspondence between reticle fragments and target layout fragments. That is, multiple reticle layout fragments can map to a single target layout fragment. An edge placement error for the target layout fragments is used to make positioning corrections for the corresponding reticle fragment(s). Edge placement error can be determined, for example, with a simulation process that simulates a manufacturing process using the reticles.

24 Claims, 18 Drawing Sheets

Begin
Select fragment from reticle layout 1100
Map selected reticle fragment to target layout 1110
All relevant reticle fragments mapped? 1120
No
Yes
All relevant reticles mapped? 1130
No
Yes
Simulate manufacture of an integrated device layer with multiple reticles 1140
Compare simulated layer to target layout 1150
Determine error metric 1160
All simulated layer fragments within tolerances 1170
No
Yes
Modify reticle layout(s) 1180
End

CONVERGENCE TECHNIQUE FOR MODEL-BASED OPTICAL AND PROCESS CORRECTION

RELATED APPLICATIONS

The present U.S. patent application is related to U.S. patent application Ser. No. 09/613,213, filed Jul. 10, 2000, entitled "INTEGRATED CIRCUIT DESIGN CORRECTION USING FRAGMENT CORRESPONDENCE."

FIELD OF THE INVENTION

The invention relates to integrated device design. More particularly, the invention relates to verification and correction techniques that can be used in an integrated device design and manufacturing process.

BACKGROUND OF THE INVENTION

As integrated circuits (ICs) become more dense, the widths of lines and components, as well as the separation between lines becomes increasingly smaller. Currently, deep sub-micron (<0.25 μm) processes are being used. However, with deep sub-micron processes, silicon yield is affected by several factors including reticle/mask pattern fidelity, optical proximity effects, and diffusion and loading effects during resist and etch processing. Typical problems include line-width variations that depend on local pattern density and topology and line end pullback.

Optical and process correction (OPC) can be used to improve image fidelity. Optical proximity correction is a subset of optical and process correction. OPC techniques include, for example, introduction of additional structures to the IC layout that compensate for various process distortions and layout modification to compensate for optical distortions. Two general categories of OPC are currently in use: rule-based OPC and model-based OPC. In rule-based OPC, a reticle layout is modified according to a set of fixed rules for geometric manipulation. However, rule-based OPC has limited capability and when more accurate OPC is desired, model-based OPC is used.

In model-based OPC, an IC structure to be formed is modeled and a threshold that represents the boundary of the structure on the wafer can be determined from simulated results generated based on the model used. Simple forms of model-based OPC generate a simulated aerial image having a threshold to predict the structure to be manufactured.

Current OPC techniques generally work well for binary (i.e., single exposure, non-phase shifted) masks. However, for manufacturing processes where two or more masks are used to manufacture a single IC layer, current OPC techniques may not converge to an acceptable result. What is needed is improved OPC that can be used with multiple exposure manufacturing techniques.

SUMMARY OF THE INVENTION

Rule-based OPC operations are performed in an integrated device design layout that results in one or more modified reticle layout. Model-based correction is performed on the modified reticle layouts.

In one embodiment, for model-based correction, a simulated layer of an integrated device to be manufactured is compared to a target layout representing a desired integrated device layer. The simulation is based on layouts of multiple reticles corresponding to the layer of the integrated device. An edge placement error is determined for one or more layout fragments based, at least in part, on the comparison of the simulated integrated device layer and the target layout. In one embodiment, one or more fragments of the layouts of the multiple reticles are mapped to corresponding fragments of the target layout. Each fragment of the layouts of the multiple reticles are mapped to one fragment of the target layout. One or more fragments of the multiple reticle layouts are modified based, at least in part, on an edge placement error of the fragment of the target layout to which the respective reticle fragments are mapped.

BRIEF DESCRIPTION OF THE DRAWINGS

The invention is illustrated by way of example, and not by way of limitation, in the figures of the accompanying drawings in which like reference numerals refer to similar elements.

DETAILED DESCRIPTION

Methods and apparatuses for integrated device design correction using segment correspondences are described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Methods and apparatuses are described herein with respect to integrated circuit manufacturing; however, the techniques described can be applied to the manufacturing and/or design process of any integrated device. Integrated devices include integrated circuits, micromachines, thin film structures such as disk drive heads, gene chips, microelectromechanical systems (MEMS), or any other article of manufacture that is manufactured using lithography techniques.

Layout correction is accomplished using a forward mapping technique. Forward mapping refers to mapping of fragments from a reticle layout to a target layout, while backward mapping refers to mapping of fragments from the target layout to the reticle layout. Forward mapping provides a technique for making an unambiguous mapping for each reticle fragment to a corresponding target layout fragment. The mapping does not necessarily provide a one-to-one correspondence between reticle fragments and target layout fragments. That is, multiple reticle layout fragments can map to a single target layout fragment. An edge placement error for the target layout fragments is used to make positioning corrections for the corresponding reticle fragment(s). Edge placement error can be determined, for example, with a simulation process that simulates a manufacturing process using the reticles.

Figure 1:
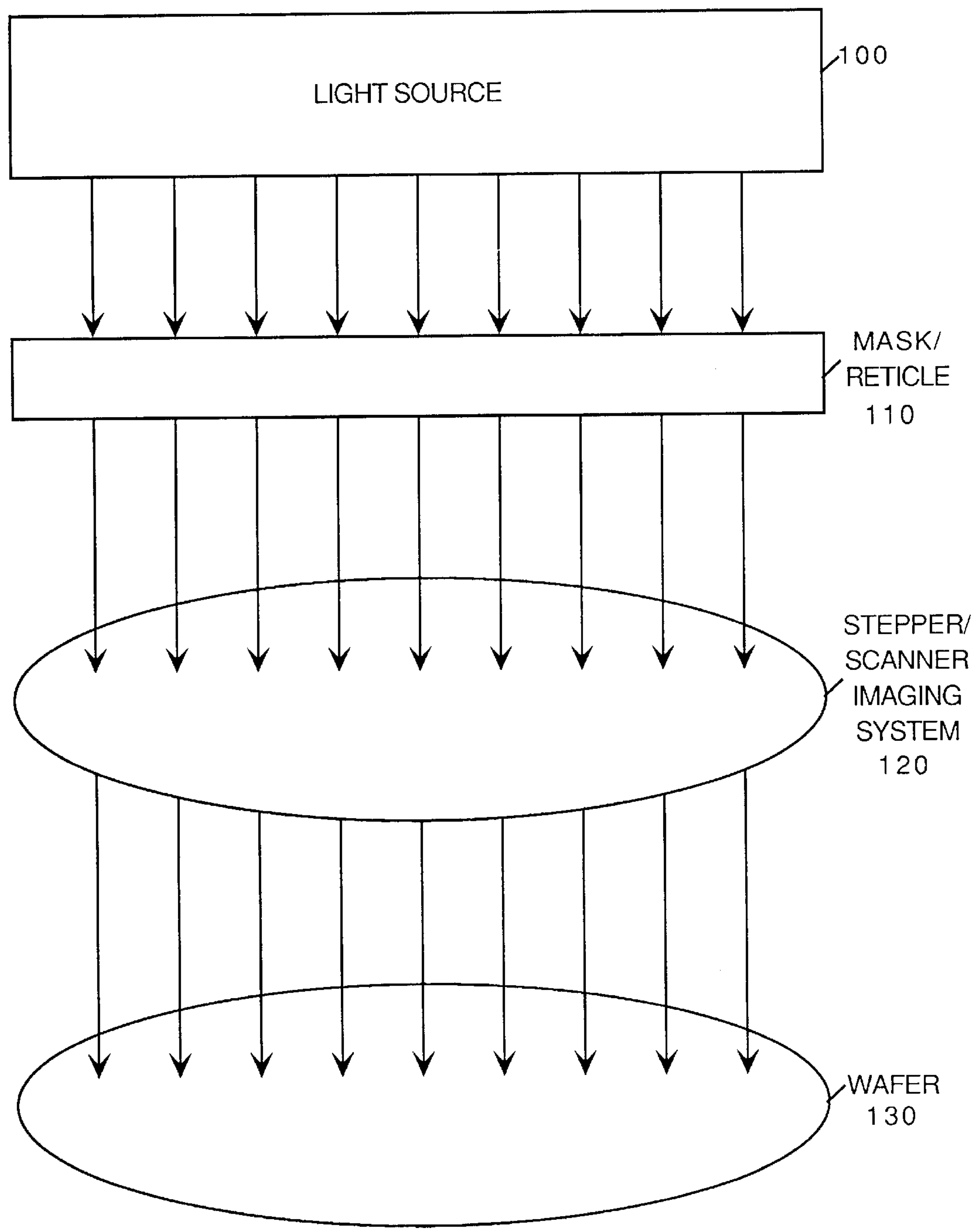
FIG. 1 is one embodiment of an integrated circuit processing arrangement.

FIG. 1 is one embodiment of an integrated circuit processing arrangement. The arrangement of FIG. 1 is suitable for use with the invention and can be used as described below. The general uses of the components of FIG. 1 are known in the art. Modifications are described in greater detail below. For example, specific reticle and/or mask configurations and modifications can be used with the remaining components of FIG. 1. Light source 100 provides light towards wafer 130. Mask/reticle 110 blocks light for certain predetermined portions of wafer 130. Stepper/scanner imaging system 120 directs the patterns of mask/reticle 110 to one of multiple integrated circuits being developed on wafer 130.

Figure 2:
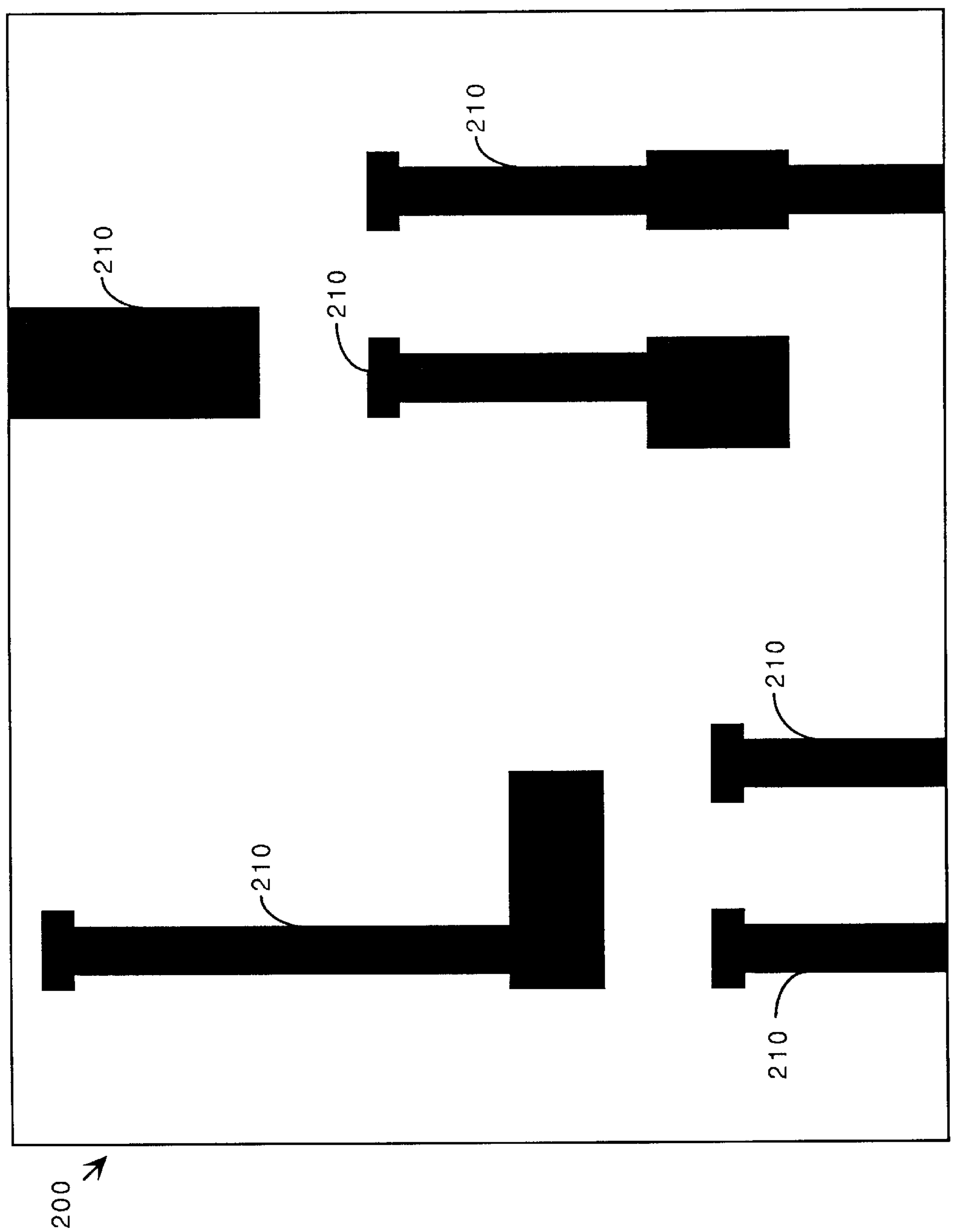
FIG. 2 is an exemplary integrated circuit layer target layout.

FIG. 2 is an exemplary integrated circuit layer target layout. The layer of FIG. 2 represents a gate layer than can be manufactured, for example, with polysilicon. While the following description refers to a gate layer, the techniques described can be used with other integrated device layers or structures such as metal interconnects or contact layers.

The design layout can be, for example, a GDS-II description of the circuit to be manufactured. Other layout formats can also be supported. The design layout describes the circuit design from which masks and/or reticles are created to realize the circuit described by the design layout.

In order to increase the operating speed of the integrated circuit having the gate layer of FIG. 2, the phase shifting techniques can be used to reduce gate width. Common phase shifting techniques are based on double exposure procedures; however, more or fewer than two exposures can be performed. In general, a phase-shifting mask or reticle is used to generate narrow regions to be used as gates. A trim mask or reticle is used to remove unwanted artifacts that are created by the phase-shifting mask/reticle.

In one embodiment, regions 210 of layout 200 represent polysilicon regions that form transistor gate regions and interconnections between structures. In the remaining portions of layout 200, no structures are formed on the layer.

As described in greater detail below, reticle design fragments can be mapped to fragments of the target layout. Fragments are not illustrated in FIG. 2; however, fragmentation is described below.

Figure 3:
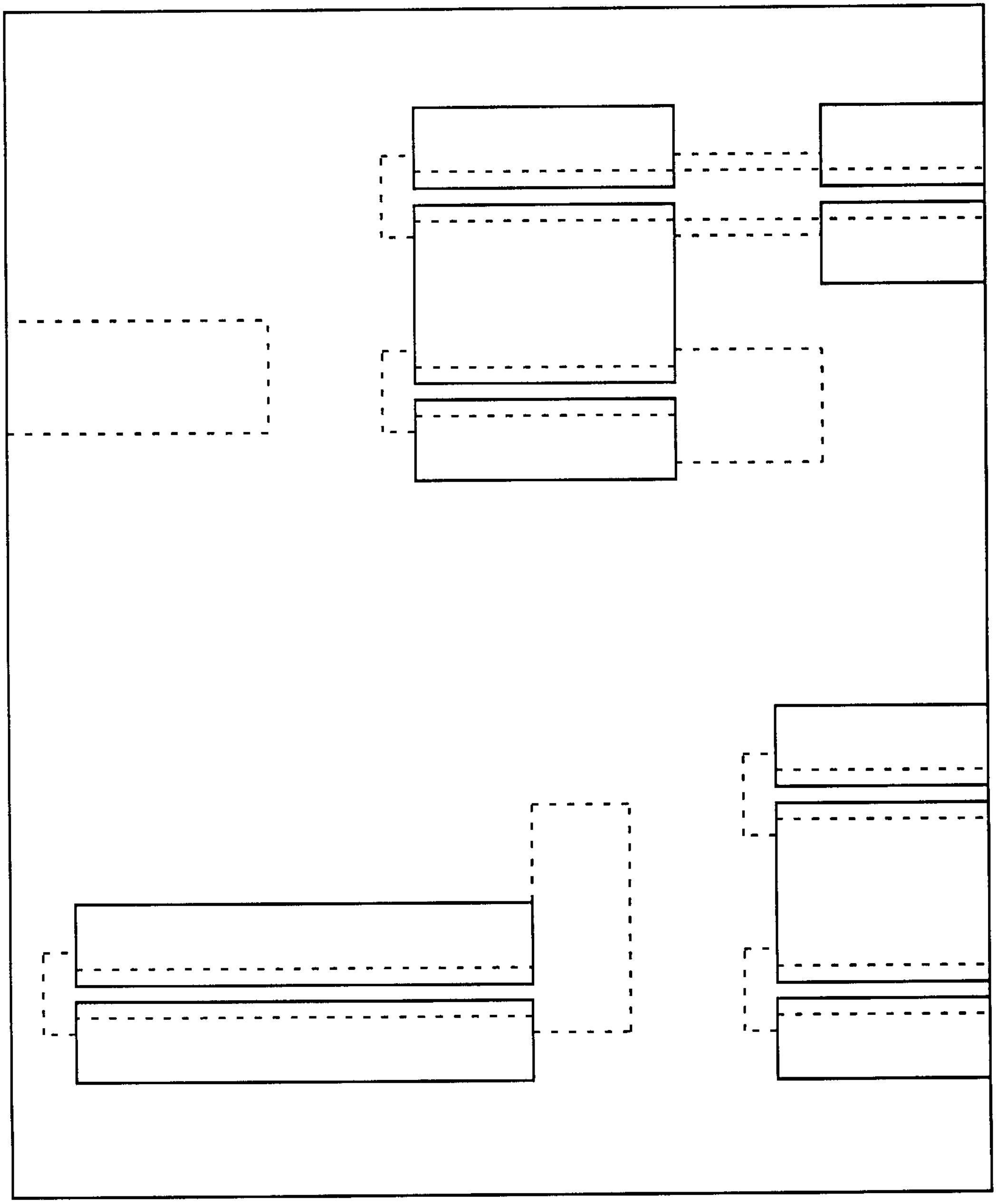
FIG. 3 is a layout for a phase-shifting reticle corresponding to the target layout of FIG. 2.

FIG. 3 is a layout for a phase-shifting reticle corresponding to the target layout of FIG. 2. The dashed lines of FIG. 3 represent polysilicon regions 210 of FIG. 2. The dashed lines are included to illustrate the relationship between the phase shifting regions of reticle 300 and the corresponding polysilicon regions. The dashed lines are not part of reticle 300.

In one embodiment, regions 310 phase shift light by 180 degrees while the neighboring regions 320 do not shift the light. The remaining regions are opaque (e.g., chrome). Other phase shifted and non-phase shifted regions can also be included in the phase shifting mask. In alternative embodiments, phase shifting other than zero degrees and 180 degrees can be used (e.g., 90° and 270° ). The phase shift mask can also be used to produce additional circuit structures other than the gates, or other regions, created using phase shifting techniques. In some embodiments, a chrome region does not overlay the boundary between a 180° phase-shifting region and a 0° phase-shifting region.

Figure 4:
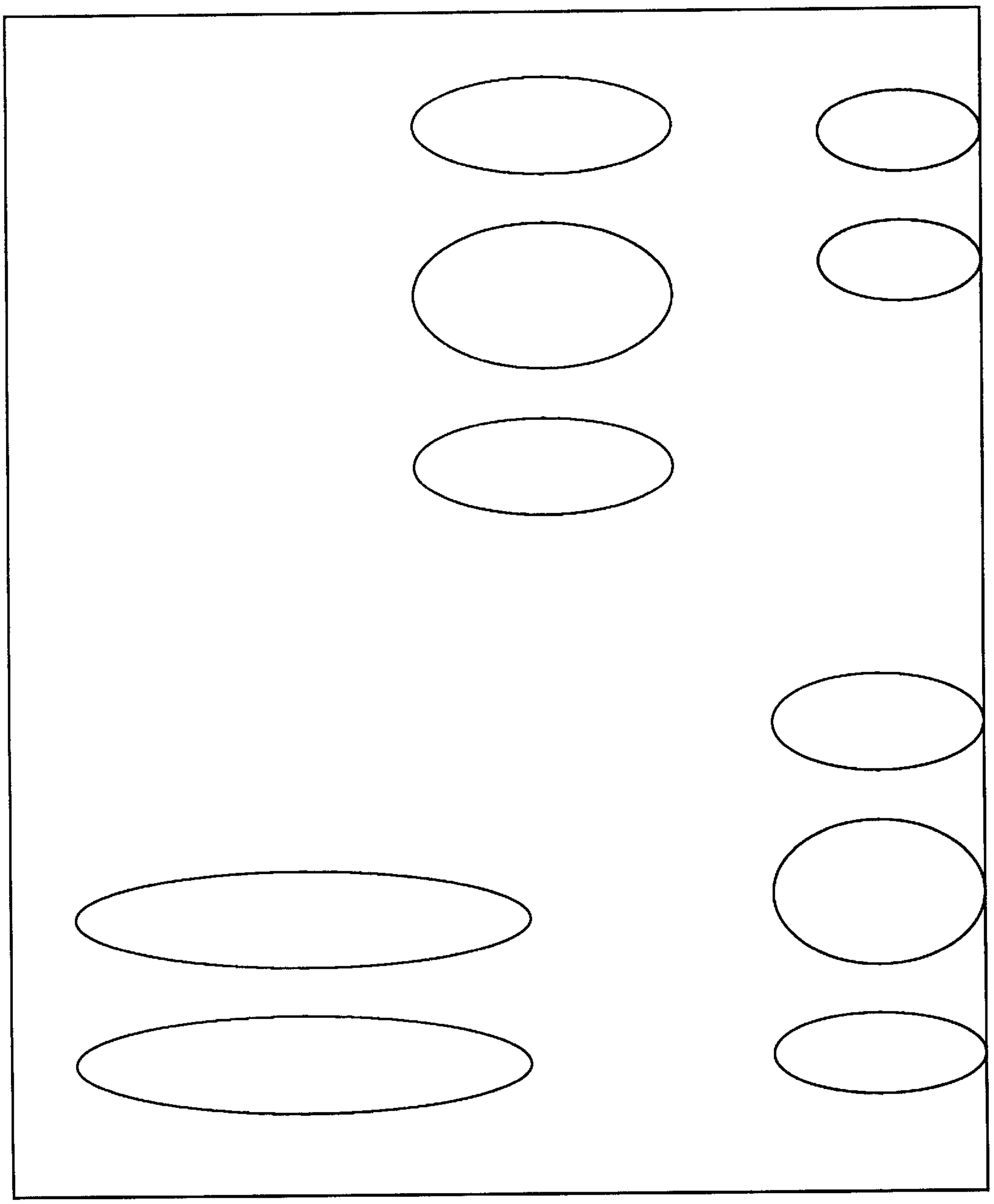
FIG. 4 is a simulated image of integrated circuit layer structures resulting from simulation of a manufacturing process using the reticle of FIG. 3.

FIG. 4 is a simulated image of integrated circuit layer structures resulting from simulation of a manufacturing process using the reticle of FIG. 3. Simulation can be accomplished in any manner known in the art. Other techniques for predicting the result of the manufacturing process can be used. For example, a lookup scheme that predicts edge placement error can be used.

Figure 5:
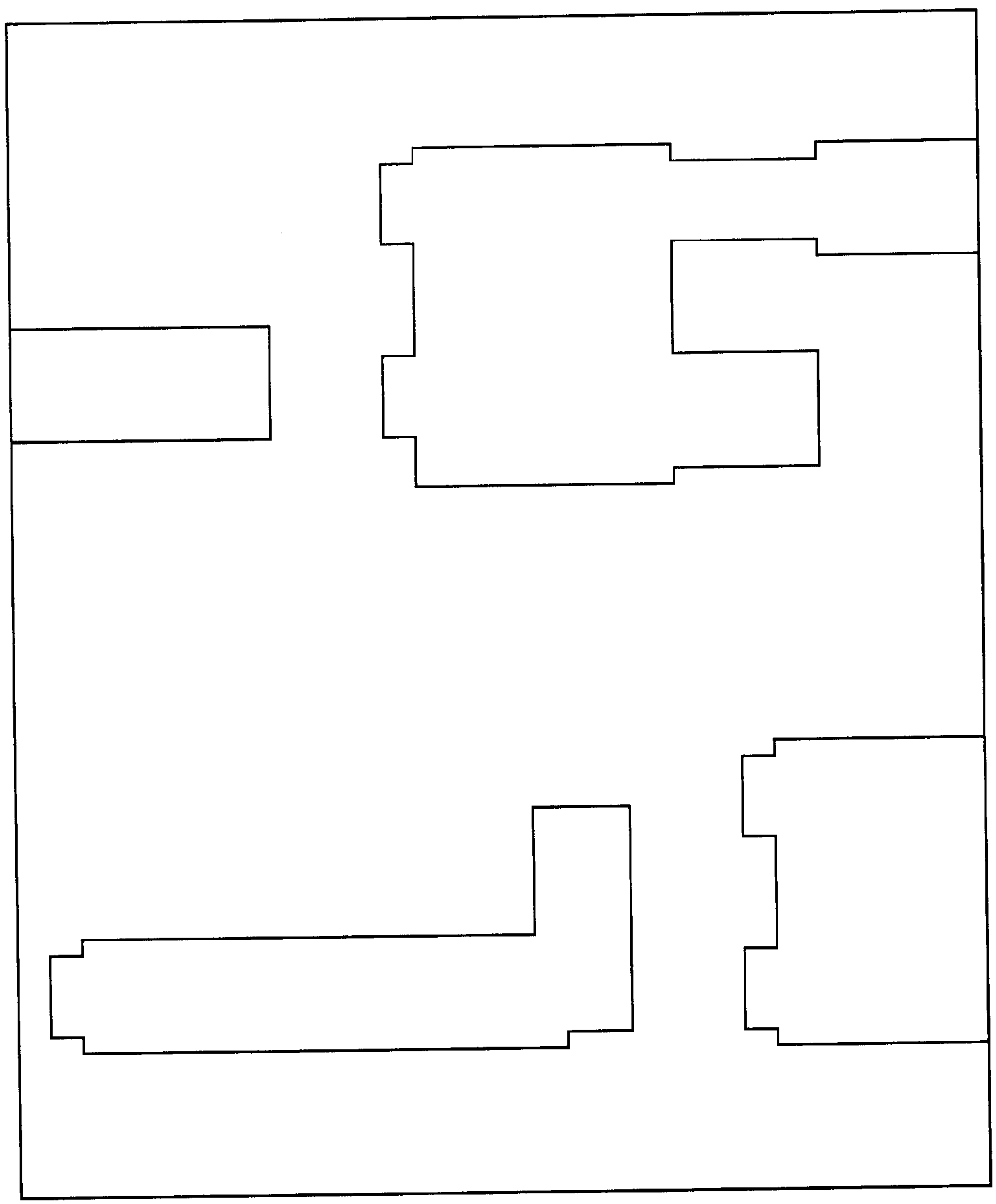
FIG. 5 is a layout for a trim reticle corresponding to the phase-shifting reticle of FIG. 3 and the target layout of FIG. 2.

FIG. 5 is a layout for a trim reticle corresponding to the phase-shifting reticle of FIG. 3 and the target layout of FIG. 2. The trim reticle protects the desired structural components created with the phase-shifting reticle and removes the unwanted artifacts created with the phase-shifting reticle and can be used to form other structures.

Figure 6:
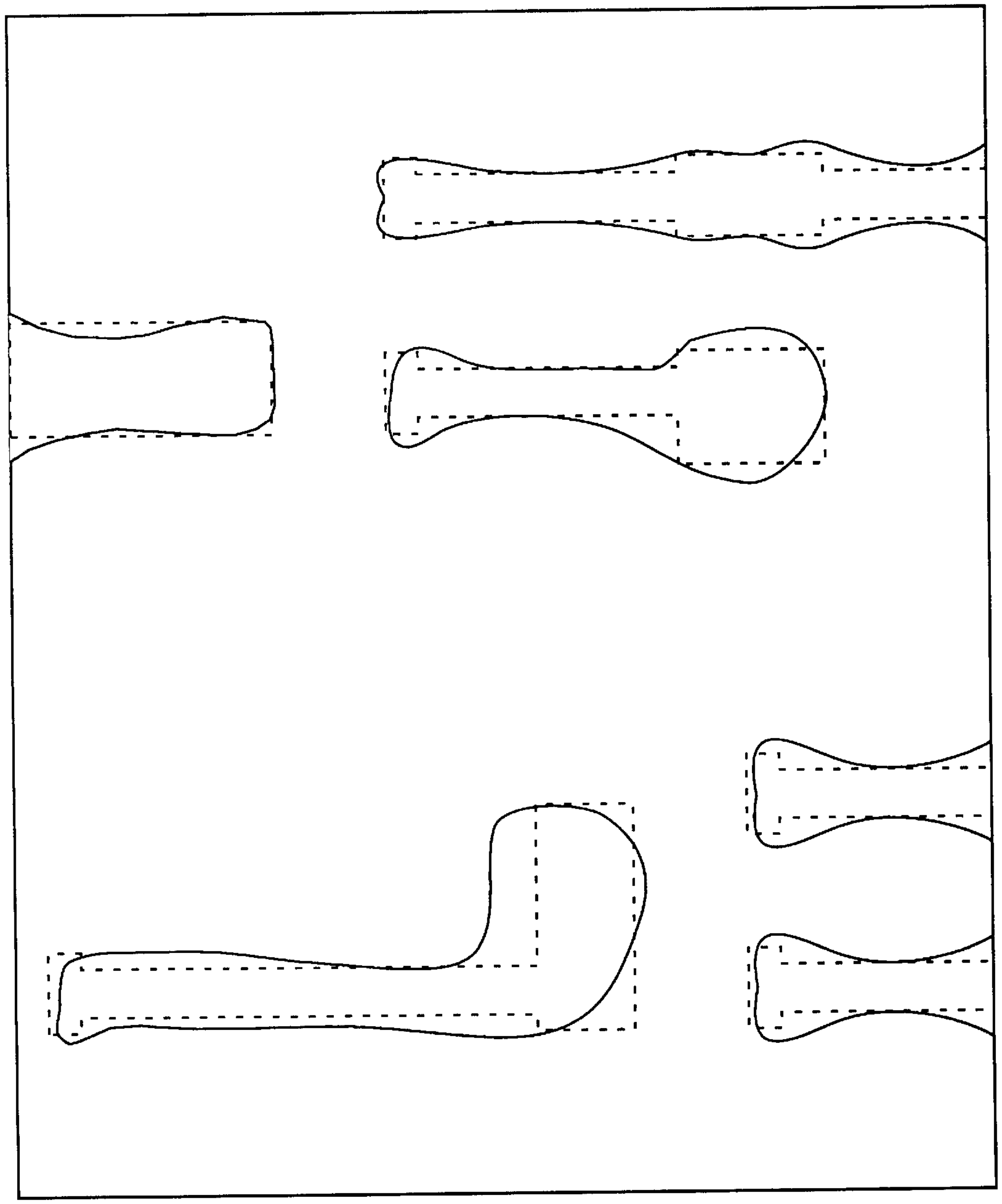
FIG. 6 is a simulated image of integrated circuit layer structures resulting from a double exposure manufacturing process using the reticles made from the layouts of FIGS. 3 and 5.

FIG. 6 is a simulated image of integrated circuit layer structures resulting from a double exposure manufacturing process using the reticles made from the layouts of FIGS. 3 and 5. The dashed lines of FIG. 6 represent the polysilicon regions of FIG. 2. FIG. 6 illustrates approximate deviations from the target layout of FIG. 2 for purposes of description. The actual deviations depend on the manufacturing process to be used, the layout of the layer, minimum line widths, etc.

As illustrated in FIG. 6, the simulated integrated circuit layer is different than the target layout. Deviations from the target layout occur, for example, at line ends, transitions between binary (non-phase-shifted) regions, and phase-shifted regions. Deviations can occur in other places as well.

Figure 7:
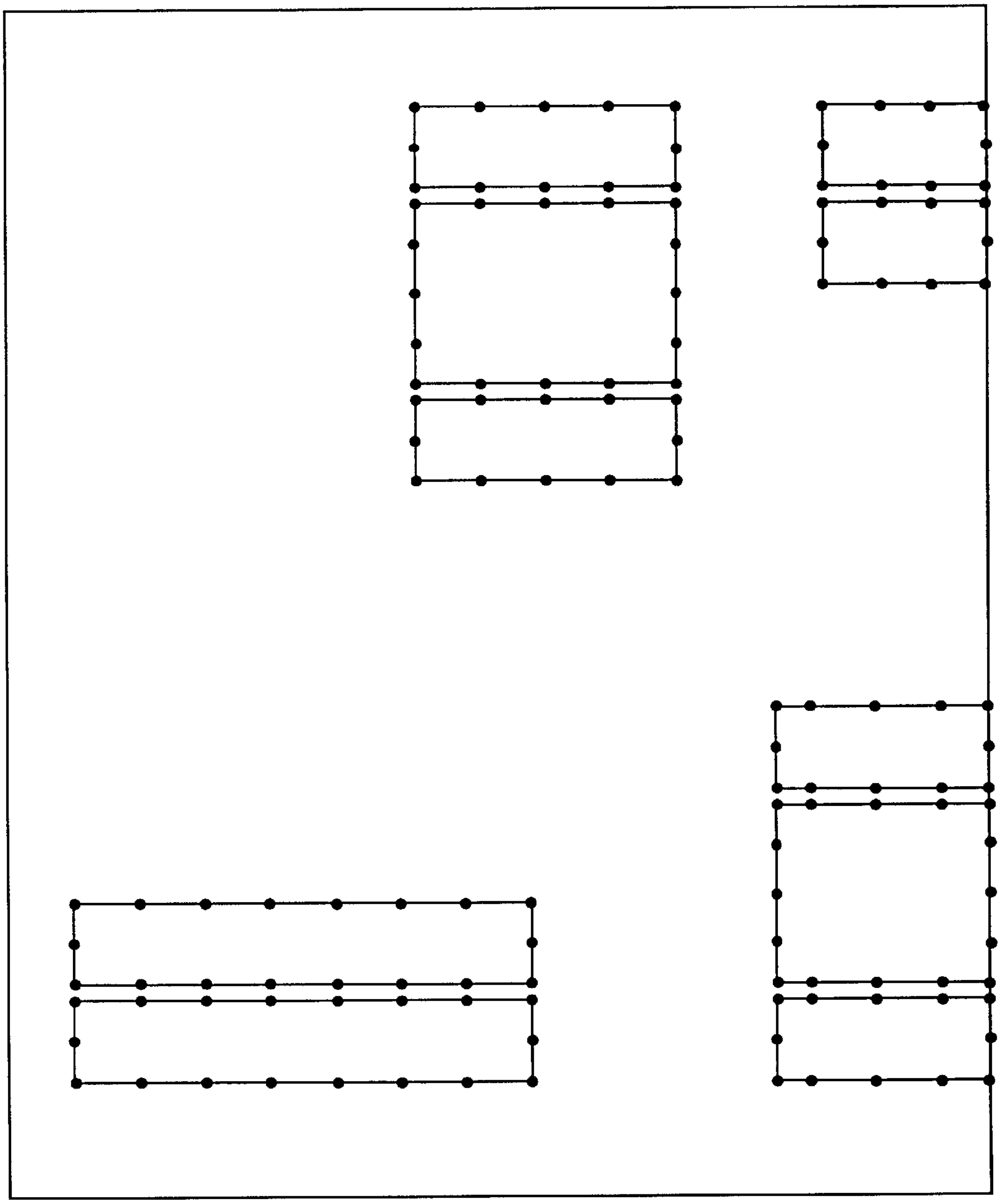
FIG. 7 illustrates one embodiment of a fragmented version of the phase-shifting reticle layout of FIG. 3.

FIG. 7 illustrates one embodiment of a fragmented version of the phase-shifting reticle layout of FIG. 3. Fragmenting involves inserting additional vertices to create smaller sections of edges, or edge fragments. The granularity of the fragments defines the fineness of the OPC corrections that can be made. Fragmentation rules generally define where vertices should be added. For example, vertices can be added so that there is no more than a maximum edge fragment length between vertices. Vertices may also be added near particular types of structural components, such as adding vertices at and/or near corners so that a corner is comprised of two short edge fragments.

The greater the number of vertices added, the more precise edge placement corrections can be made at the expense of increased OPC computations. In other words, increasing the granularity of edge fragments increases potential OPC accuracy but decreases speed. Generally, densely filled areas are likely to need more intricate edge placement correction than sparsely filled areas, so, in one embodiment, more vertices may be added to densely filled areas than to sparsely filled areas.

As described in greater detail below, in one embodiment, the fragments are mapped to corresponding fragments in the target layout. The position of the fragments of the phase-shifting reticle layout are modified based on the edge placement error of the corresponding fragment in the target layout. In an alternate embodiment, reticle layout fragments are mapped to fragments of the simulated layer. The edge placement error of the simulated layer fragment is used to modify the reticle layout.

Edge placement error is the deviation of the simulated structure fragment (or actual structure fragment) from the corresponding target layout fragment. Edge placement error can be described in terms of axes (e.g., x-axis, y-axis and/or z-axis) and distance (e.g., 0.10 $\mu$m), or in any other appropriate manner to describe the offset of the simulated/actual structure as compared to the target layout. Other error metrics can also be used. For example, edge slop deviation can be used as an error metric.

Figure 8:
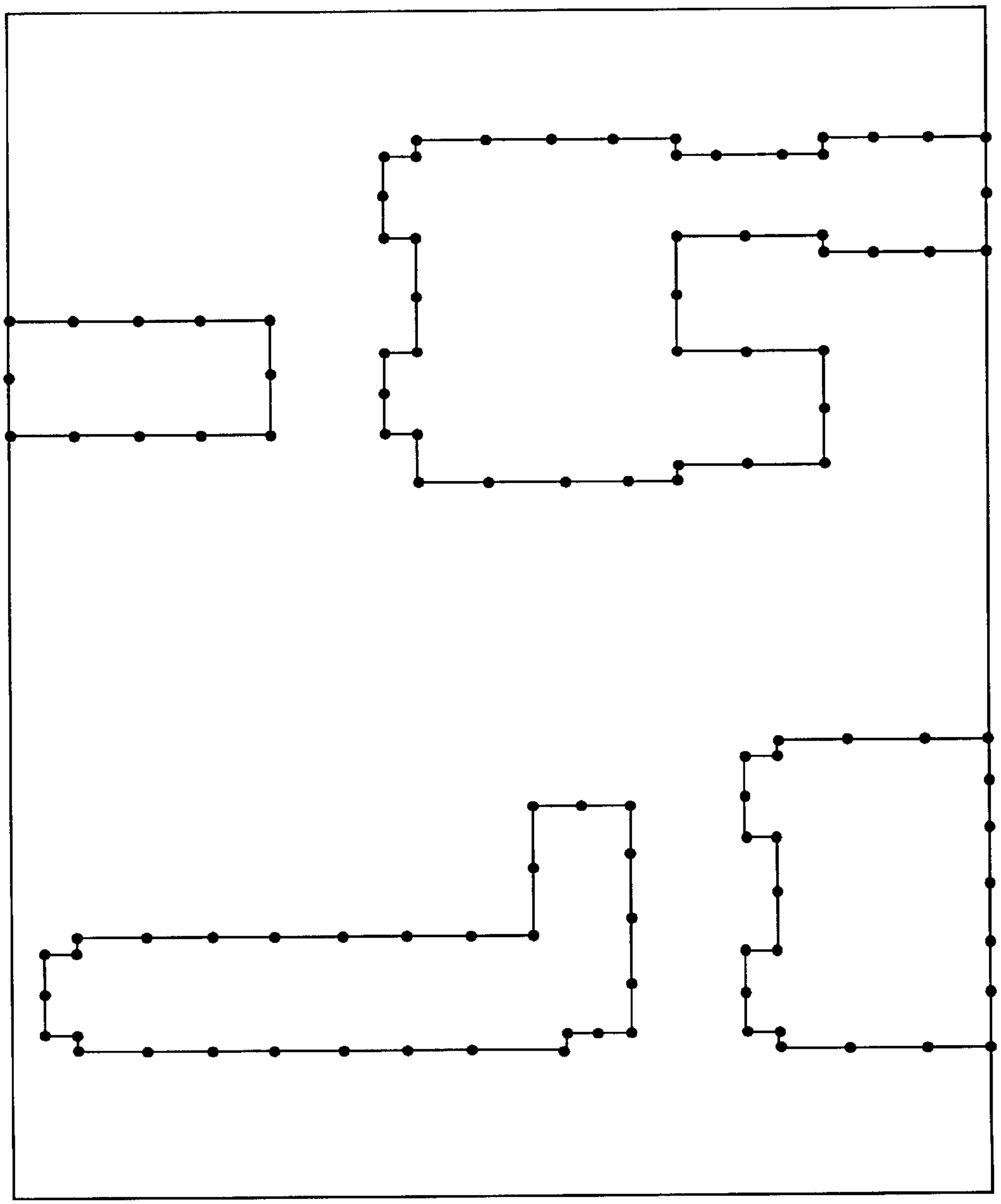
FIG. 8 illustrates one embodiment of a fragmented version of the trim reticle of FIG. 5.

FIG. 8 illustrates one embodiment of a fragmented version of the trim reticle layout of FIG. 5. In one embodiment, the trim reticle of FIG. 8 is fragmented, mapped to the target layer and modified in a similar manner as the fragmented phaseshifting reticle of FIG. 7. In an alternate embodiment, fragments from the trim reticle layout are mapped to the simulated layer and the layout of the trim reticle is modified based on the edge placement error of the simulated layer fragments.

Figure 9:
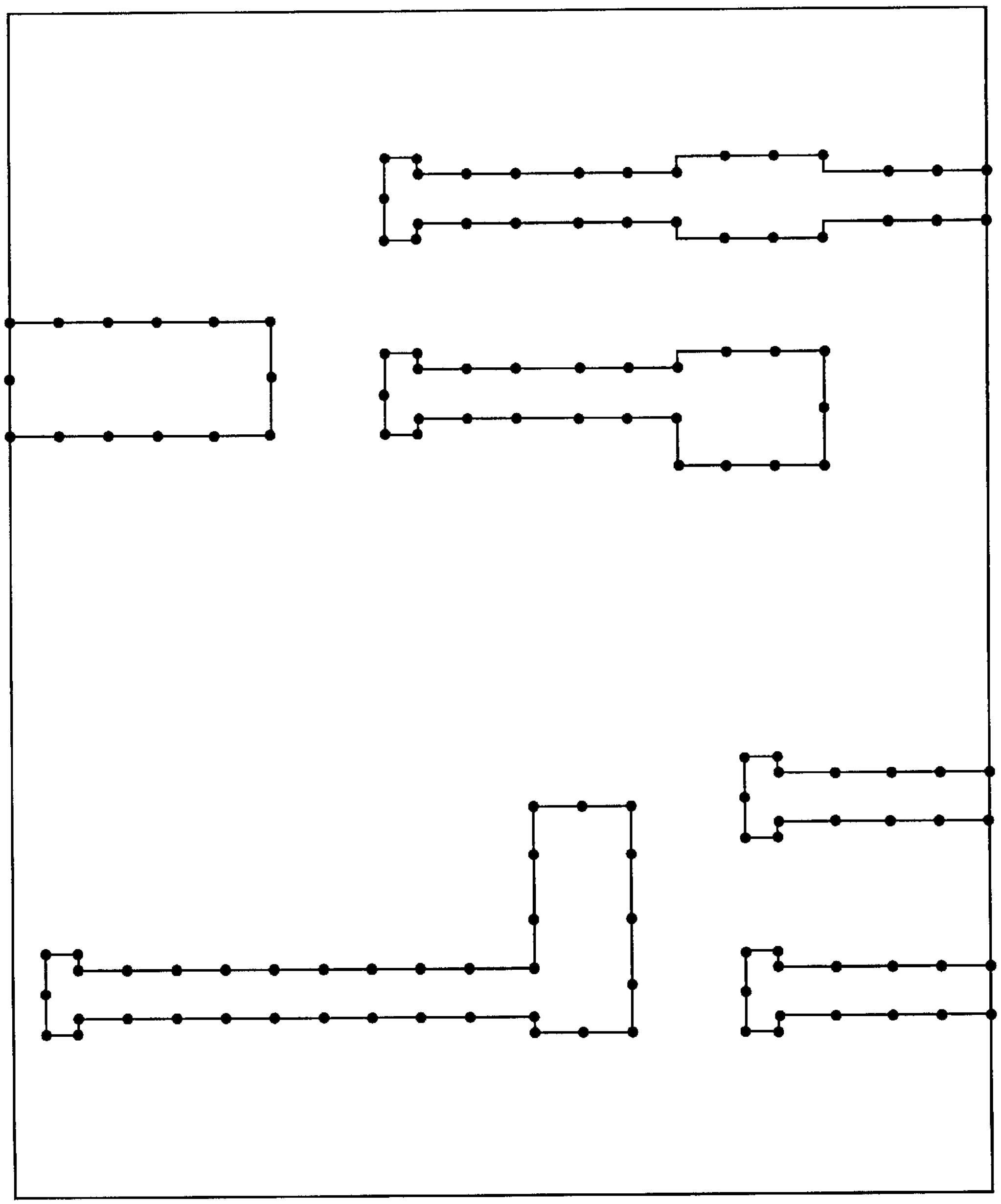
FIG. 9 illustrates one embodiment of a fragmented version of the target layout.

FIG. 9 illustrates one embodiment of a fragmented version of the target layout. In one embodiment, fragments of the target layout are compared to fragments of a corresponding simulated layer to determine an edge placement error for the fragments.

Figure 10:
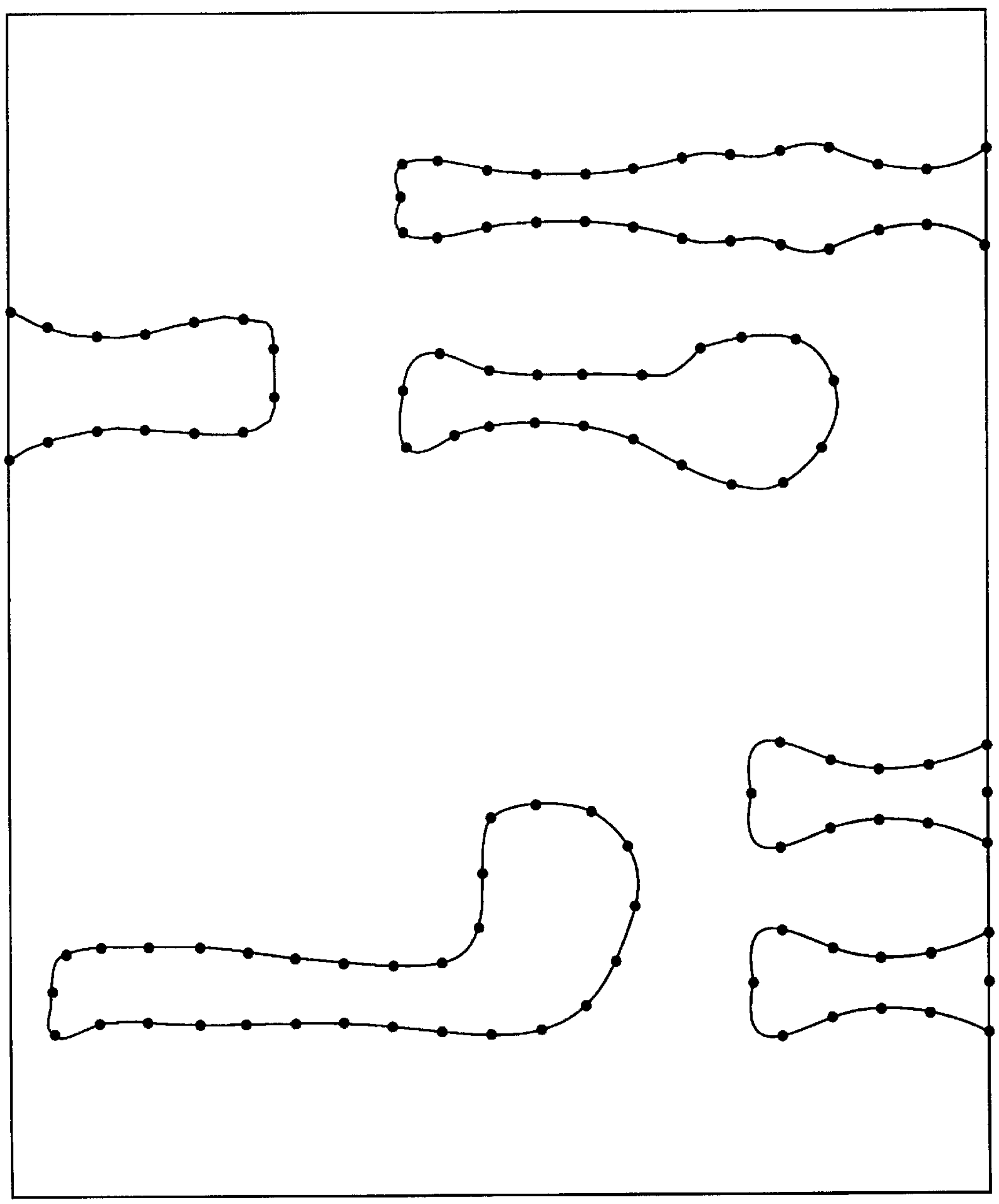
FIG. 10 illustrates one embodiment of a fragmented version of the simulated integrated circuit layer structure of FIG. 6.

FIG. 10 illustrates one embodiment of a fragmented version of the simulated integrated circuit layer structure of FIG. 6. In one embodiment, the fragments of the simulated layer of FIG. 10 are compared to corresponding fragments of the target layout of FIG. 9. FIG. 6 illustrates non-fragmented overlap of the target layout and the simulated result. The edge placement error of a fragment describes the deviation of the position and/or shape of the simulated fragment from the corresponding target layout fragment.

Figure 11:
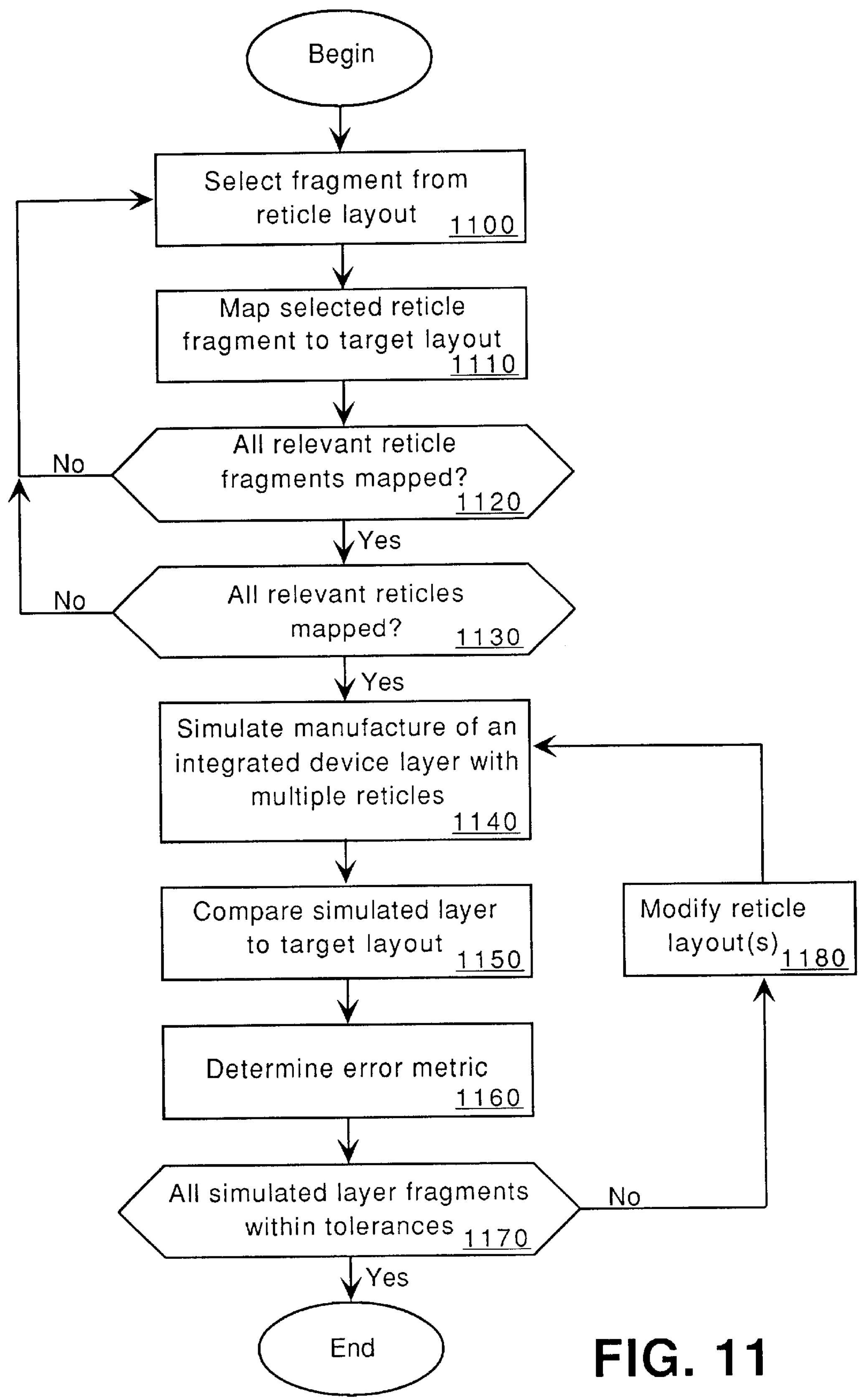
FIG. 11 is a flow chart of one embodiment of reticle layout correction based on edge placement error of a target layout.

FIG. 11 is a flow chart of one embodiment of reticle layout correction based on edge placement error of a target layout. A fragment from a reticle layout is selected at 1100. The fragments can be selected in any manner. Because multiple reticle layout fragments can be mapped to a single simulated layer fragment, the order in which fragments are selected is not important.

The selected reticle layout fragment is mapped to a corresponding fragment of the target layout at 1110. Mapping of reticle layout fragments to target layout fragments is described in greater detail below. In alternate embodiments, reticle layout fragments are mapped to fragments of the simulated device layer and error metrics are associated with the simulated device layer fragments rather than with the target layout fragments.

If all relevant reticle layout fragments are not mapped at 1120, a new fragment is selected at 1100 and mapped at 1110. In other words, selection and mapping of fragments is repeated until all relevant fragments from a reticle layout are mapped. As mentioned above, all fragments from a reticle layout can be mapped, or a subset of fragments can be mapped.

If all relevant reticle layouts have not been mapped at 1120, a new fragment is selected from a new reticle layout at 1100 and mapped at 1110. If all relevant reticle layouts have been mapped at 1130, manufacturing of the integrated device layer is simulated at 1140.

In one embodiment, the integrated device is an integrated circuit; however, as mentioned above, other integrated devices can be manufactured in a similar manner. Simulation of the layer based on the reticle layouts can be accomplished in any manner known in the art.

The simulated layer is compared to the target (design) layout at 1150. In one embodiment, fragments of the simulated layer are compared to fragments of the target layout. An error metric (e.g., edge placement error) is determined for one or more fragments of the simulated layer at 1160. In one embodiment, an error metric is determined for each fragment; however, in alternate embodiments, an error metric can be determined for a subset of fragments.

If all simulated layer fragments are not within the predetermined layer fragment edge placement error tolerances at 1170, the corresponding fragments of the reticle layouts are moved to modify the reticle layout at 1180. Multiple reticle layout fragments may be moved based on the edge placement error of a single fragment. This allows the design correction to converge more rapidly than if the multiple reticle layout fragments were moved at one time, which would slow, or possibly prevent, convergence.

The modified reticle layout is simulated at 1140 and compared to the target layout at 1150. A new error metric, based on the comparison of the modified reticle layout(s) and the target layout, at 1160. The new error metric is used to determine whether the simulated layer fragments are within the predetermined tolerances at 1170. If not, the modification, simulation, comparison, and error determinations are repeated as necessary.

Modification of the reticle layout fragments can be accomplished by many different techniques. For example, a fragment can be moved based on a percentage of the edge placement error corresponding to the fragment. The percentage can be different for different reticles. The percentage can also be dynamically modified based on the number of iterations already performed, or the accumulated effect of previous movements.

Figure 12:
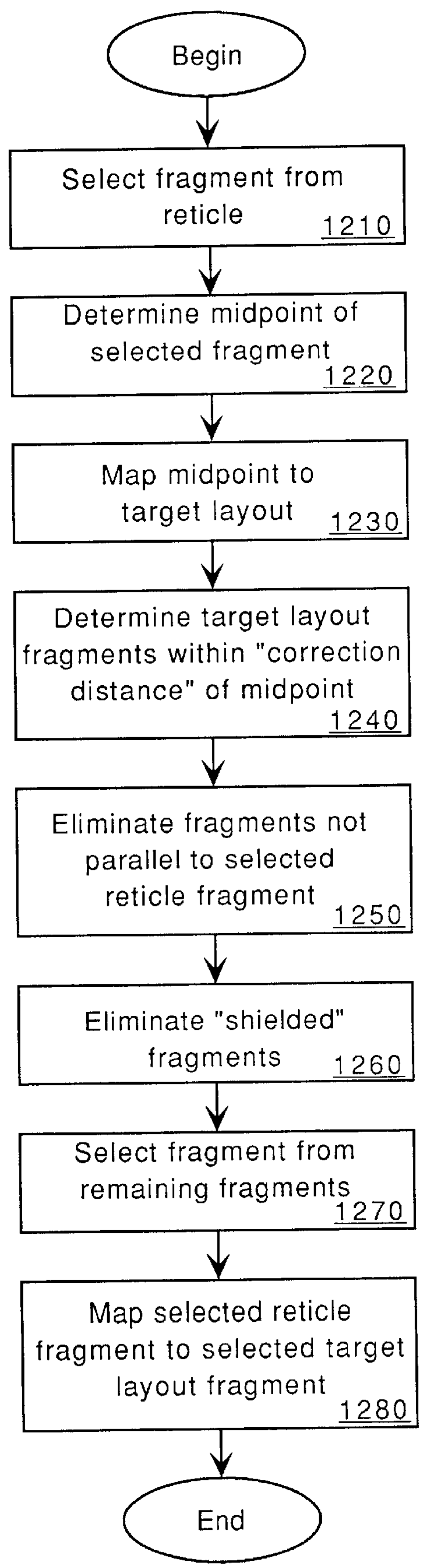
FIG. 12 is a flow diagram of one embodiment for mapping reticle fragments to target layout fragments.

FIG. 12 is a flow diagram of one embodiment for mapping reticle layout fragments to target layout fragments. While the mapping is described in terms of mapping reticle fragments to target layout fragments, the reticle layout fragments can also be mapped to simulated integrated device layers in a similar manner.

A fragment from the reticle layout to be mapped is selected at 1210. As mentioned above, the sequence in which reticle layout fragments are selected is not important. The mid point of the fragment is determined at 1220. The midpoint of a fragment can be determined by any manner known in the art. In alternate embodiments, points other than the midpoint (e.g., end points, predetermined offset from the midpoint) can be used for mapping.

The midpoint of the selected reticle fragment is mapped to a point in the target layout at 1230. In one embodiment, a transformation function is determined to transform points from the reticle (the reticle domain) to the target layout (the target domain) and vice versa. In such an embodiment, the coordinates of the midpoint are evaluated using the transformation function to determine the corresponding coordinates in the target layout. Any type of domain transformation (e.g., the identity transform) known in the art can be used.

From the midpoint in the layout domain, all layout fragments within a predetermined "correction distance" ($T_d$) are determined at 1240. In other words, only fragments within a predetermined radius of the midpoint in the layout domain are considered potential layout fragments to which the selected reticle fragment can be mapped. In alternate embodiments, shapes other than circles can be used to determine potential layout fragments. For example, the target layout can be tiled and a predetermined number of tiles can be used to define the correction distance, or a predetermined number of closest layout fragments can be used to define the correction distance.

Within the correction distance, target layout fragments that are not approximately parallel to the selected reticle fragment are eliminated from being potential layout fragments to which the selected reticle fragment can be mapped at 1250. Within the correction distance, target layout fragments that are "shielded" are eliminated from being potential layout fragments to which the selected reticle fragment can be mapped at 1260. A fragment is shielded if a layout fragment exists between the shielded layout fragment and the midpoint as mapped to the layout domain.

A single layout fragment is selected from the remaining potential fragments at 1270. In one embodiment, a weighted distance estimate is used to select the fragment from the remaining fragments. In one embodiment, the weighted distance estimate includes both the angle between the midpoint of the reticle fragment in the layout domain and the midpoint of the potential layout fragments as well as the distances between the two midpoints. Other calculation methods can also be used.

The reticle fragment is mapped to the selected target layout fragment at 1280. The process of FIG. 12 is repeated for each reticle layout fragment that is to be mapped to a target layout fragment. As mentioned above, multiple reticle layout fragments from one or more reticles can map to a single layout fragment. It is also possible that some reticle fragments remain unmapped.

Figure 13A:
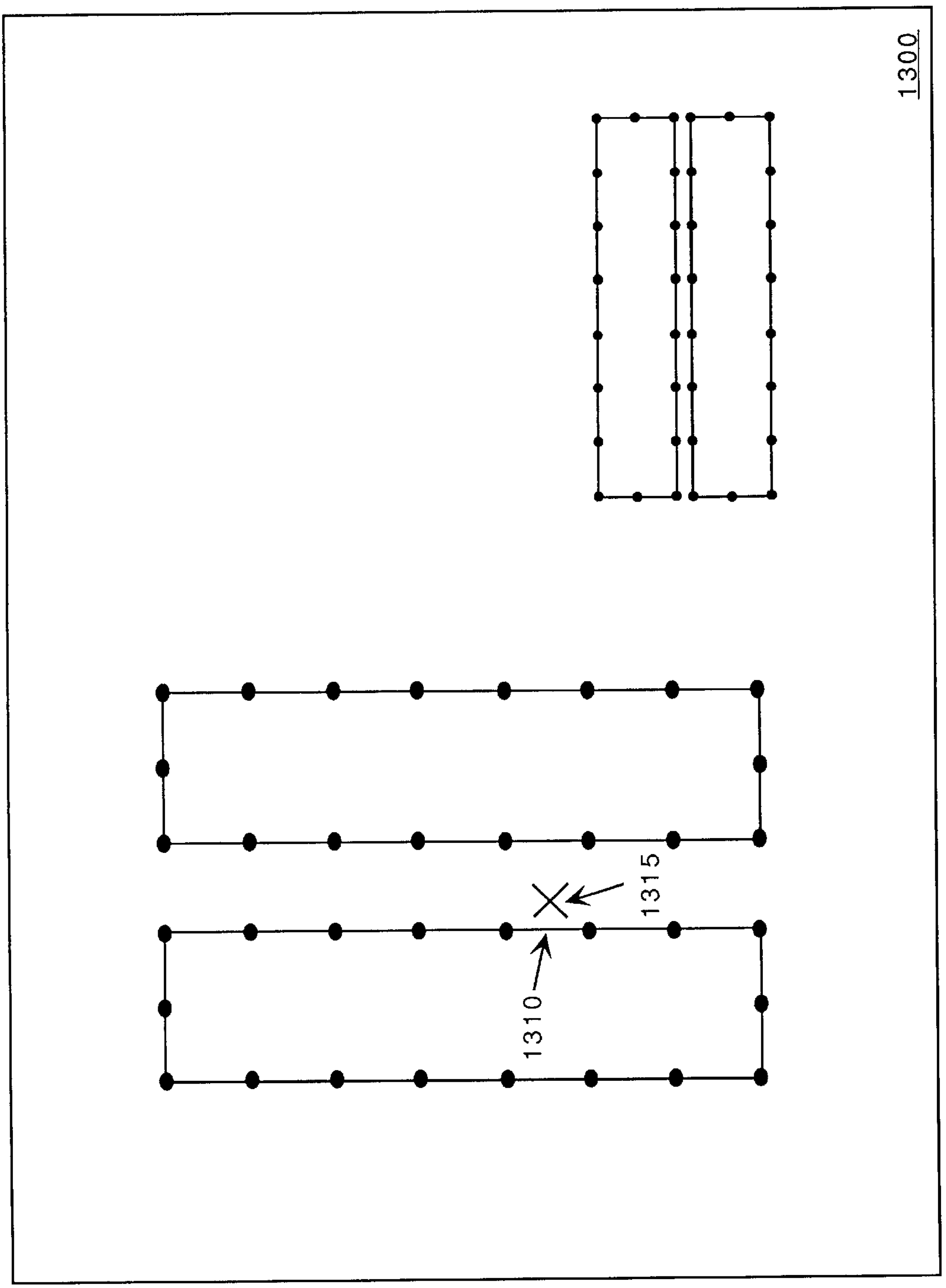
FIGS. 13*a* and 13*b* illustrate an exemplary mapping of a reticle fragment to a target layout fragment.
Figure 13B:
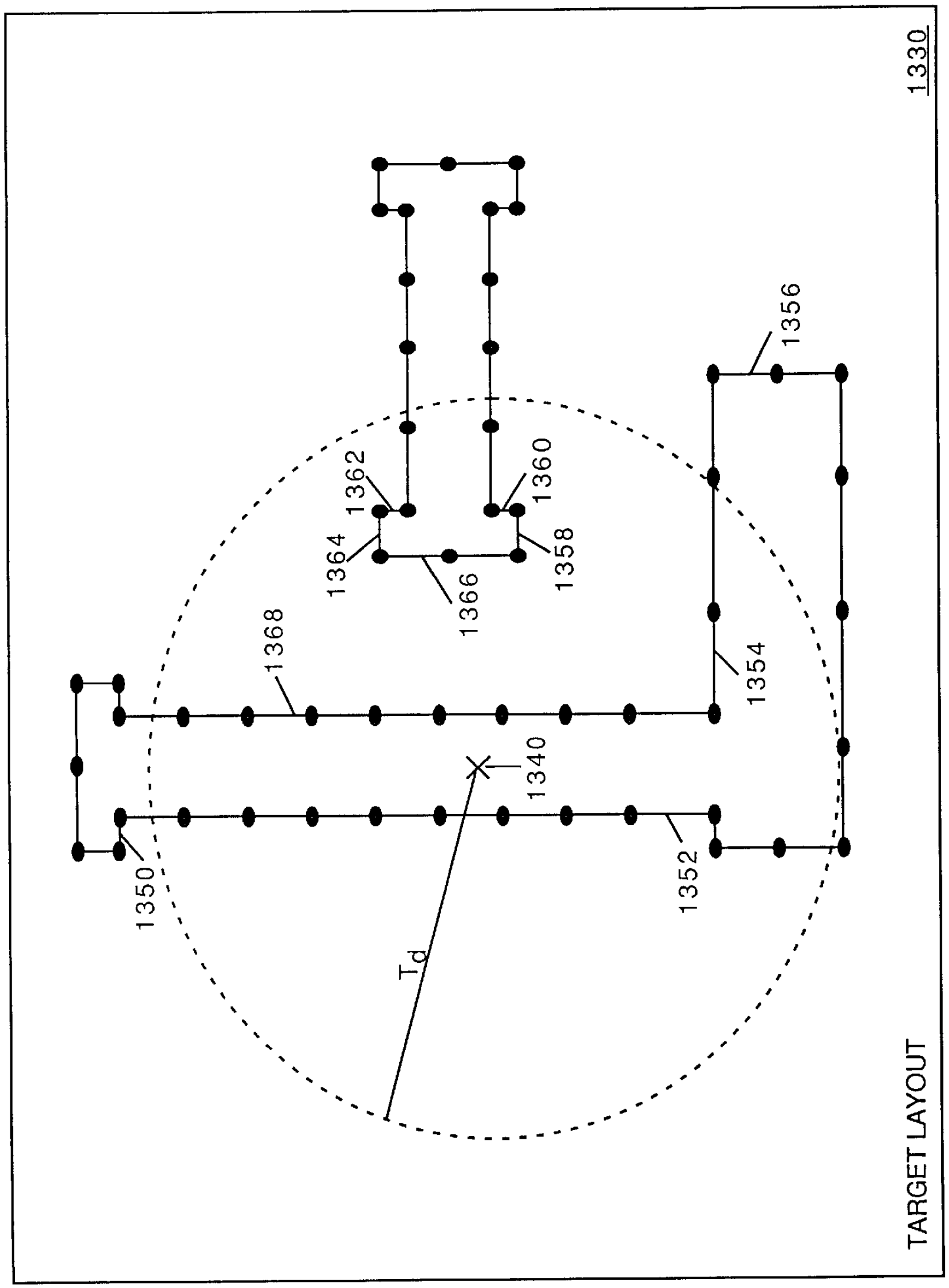

FIGS. 13*a* and 13*b* illustrate an exemplary mapping of a reticle fragment to a target layout fragment. While the example of FIGS. 13*a* and 13*b* are described in terms of a phase-shifting reticle, fragments from any type of reticle can be mapped in a similar manner.

For the example of FIG. 13*a*, fragment 1310 from phase shifting reticle 1300 is mapped to the layout domain corresponding to target layout 1330. Other fragments are mapped in a similar manner. Midpoint 1315 of reticle fragment 1310 is mapped to point 1340 on target layout 1330.

From point 1340 in FIG. 13*b*, the fragments of the following layout lines are within the correction distance, $T_d$: 1350, 1352, 1354, 1356, 1358, 1360, 1362, 1364 and 1366. In one embodiment, fragments that are partially within the radius of the correction distance are considered within the correction distance. In alternate embodiments, a fragment must be completely within the radius of the correction distance to be considered within the correction distance.

Of the fragments within the correction distance, only fragments of lines 1352, 1356, 1360, 1362 and 1366 are parallel to the reticle fragment. Of the parallel fragments, only the fragments of lines 1352 and 1368 are not shielded. Lines 1352 and 1368 are illustrated in greater detail in FIG. 14.

Figure 14:
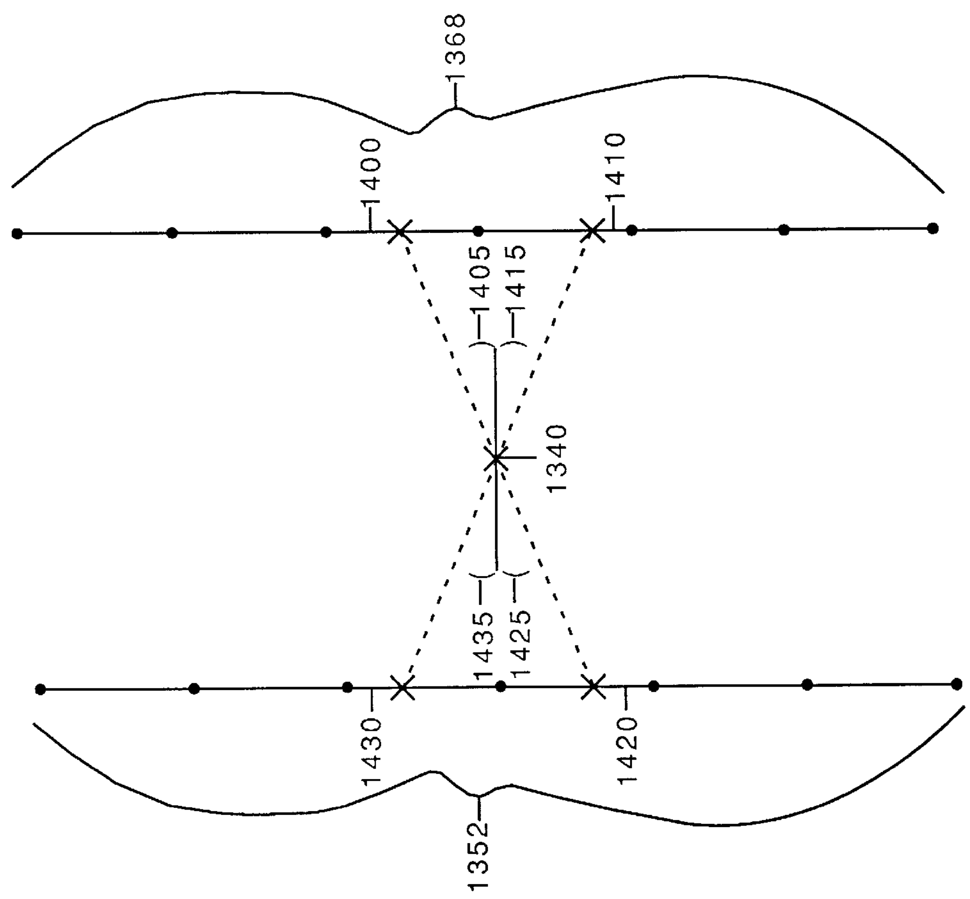
FIG. 14 illustrates a simplified version of target layout 1330 including the lines that are not shielded and parallel to the midpoint of the reticle fragment as mapped to the layout domain.

FIG. 14 illustrates a simplified version of target layout 1330 including the lines that are not shielded and parallel to the midpoint of the reticle fragment as mapped to the layout domain. The lines and fragments of FIG. 14 are presented for simplicity of description, the remaining fragments are unaffected by the mapping process described with respect to FIG. 14.

In one embodiment, the angle and distance between point 1340 and the midpoints of the fragments are determined. In alternate embodiments, other methods (e.g., distance only, angle only) can be used or fewer fragments (e.g., a predetermined number) can be used, angle and/or distance to a point other than the midpoint (e.g., end point) can be used. For reasons of simplicity, only the angles and distances between point 1340 and the midpoints of fragments 1400, 1410, 1420 and 1430 are illustrated.

Assuming the distances between point 1340 and the midpoints of fragments 1400, 1410, 1420 and 1430 are equal, the fragment that is selected for mapping is determined based on the angle of the line from point 1340 to the respective midpoints. In one embodiment, if the distances are equal, the fragment with the smallest angle is chosen. For example, in FIG. 14, angle 1435 is the smallest angle followed, in order by angles 1405, 1415 and 1425. Thus, if the distances are equal, fragment 1430 is selected for mapping. In alternate embodiments, the angles can be determined in another manner, which would result in a different fragment (e.g., 1400, 1410 or 1420) being selected for mapping.

Assuming the distances between point 1340 and the respective midpoints is not equal the distance will factor into the selection of the fragment for mapping. In one embodiment, angle is weighted more heavily than distance; however, in alternate embodiments, distance can be weighted more heavily than angle.

Figure 15:
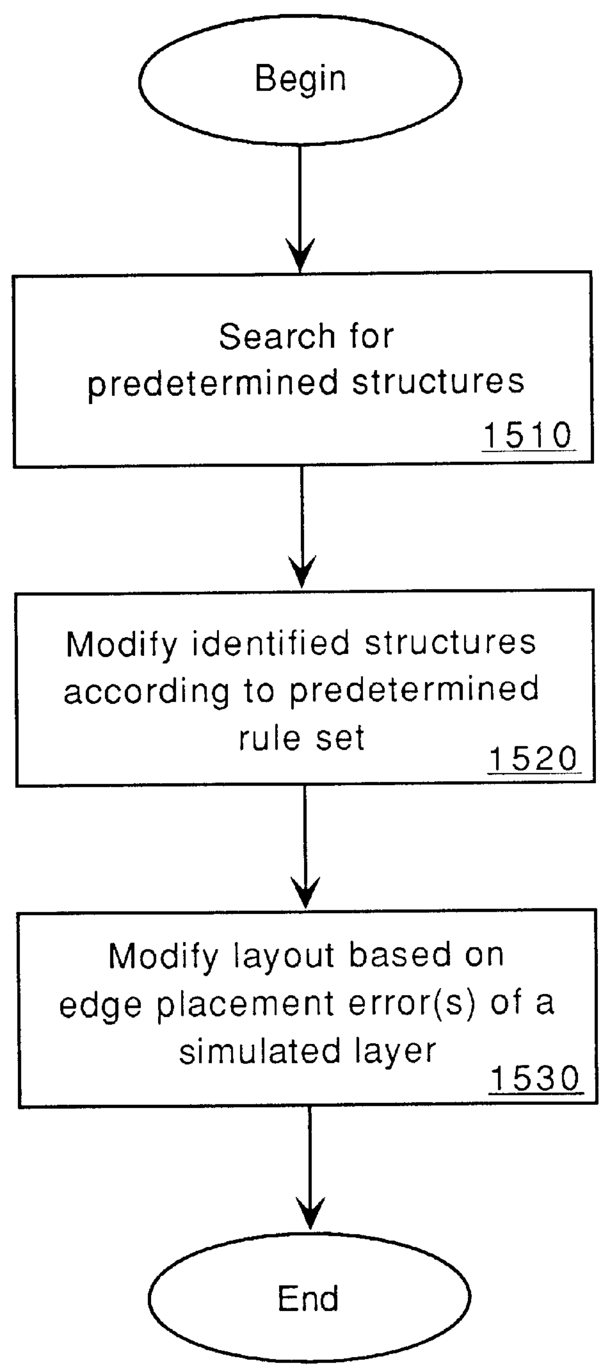
FIG. 15 is a flow diagram of one embodiment of applying rule-based OPC to a layout prior to layout correction based on edge placement error of a simulated integrated device layer.

FIG. 15 is a flow diagram of one embodiment of applying rule-based OPC to a layout prior to layout correction based on edge placement error of a simulated integrated device layer. Application of rule-based OPC prior to the layout correction described above is not necessary to practice layout correction based on edge placement error of a simulated integrated device layer; however, doing so improves performance because fewer iterations are generally required to achieve a set of reticles that satisfy predetermined edge placement error tolerance requirements.

One example of rule-based OPC that can be applied to a layout is the addition of assist features, for example, subresolution bars along an interconnection line, hammer head shapes at line ends, or serifs at a line corner. Other assist features can also be provided.

An electronic design automation (EDA) or other type (e.g., layout, verification) of tool searches for predetermined structures at 1510. In one embodiment a set of parameters is used to identify structures that can benefit from rule-based OPC correction. For example, line ends can be modified to a "hammer head" shape to compensate for line end shortening.

The identified structures are modified according to a predetermined rule set at 1520. For example, line ends can be modified to a "hammer head" shape to compensate for line end shortening. Various embodiments of rule-based OPC are described in greater detail in U.S. patent application Ser. No. 09/302,700 filed Apr. 30, 1999 and entitled "IMPROVED METHOD AND APPARATUS FOR SUB-MICRON IC DESIGN USING EDGE FRAGMENT TAGGING," which is assigned to the corporate assignee of the present application.

The layout is modified based on edge placement error(s) of one or more fragments of a simulated layer at 1530. This can be accomplished as described above. Other OPC techniques and/or EDA techniques can also be combined with correction based on edge placement error and/or rule based OPC techniques.

Figure 16:
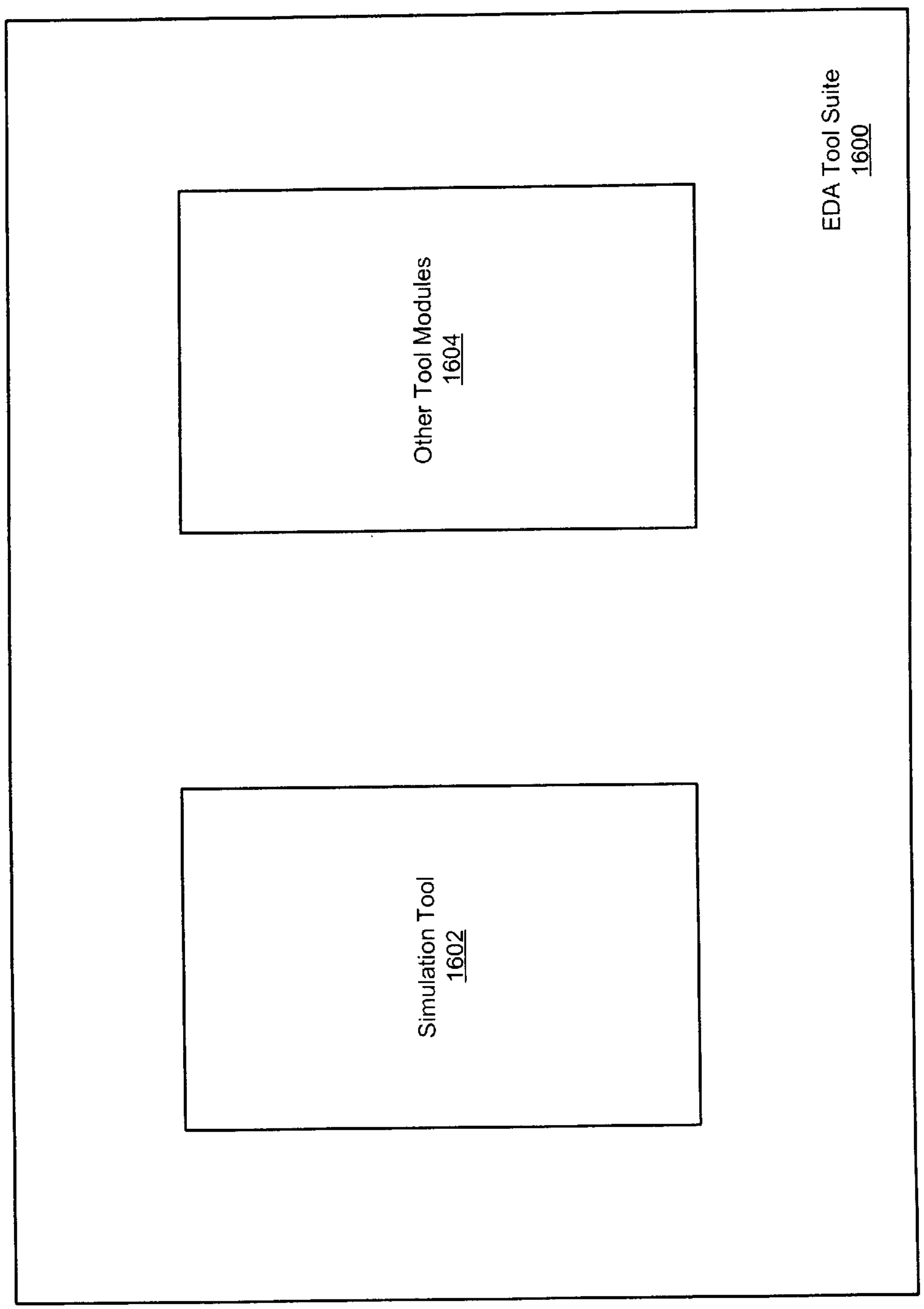
FIG. 16 illustrates an EDA tool incorporated with the simulation tool of the present invention in accordance with one embodiment is shown.

FIG. 16 illustrates an EDA tool incorporated with the simulation tool of the present invention in accordance with one embodiment is shown. As illustrated, EDA tool suite 1600 includes simulation tool 1602 incorporated with the teachings of the present invention as described earlier. Additionally, EDA tool suite 1600 includes other tool modules 1604. Examples of these other tool modules 1604 include but are not limited to synthesis module, layout verification module and so forth.

Figure 17:
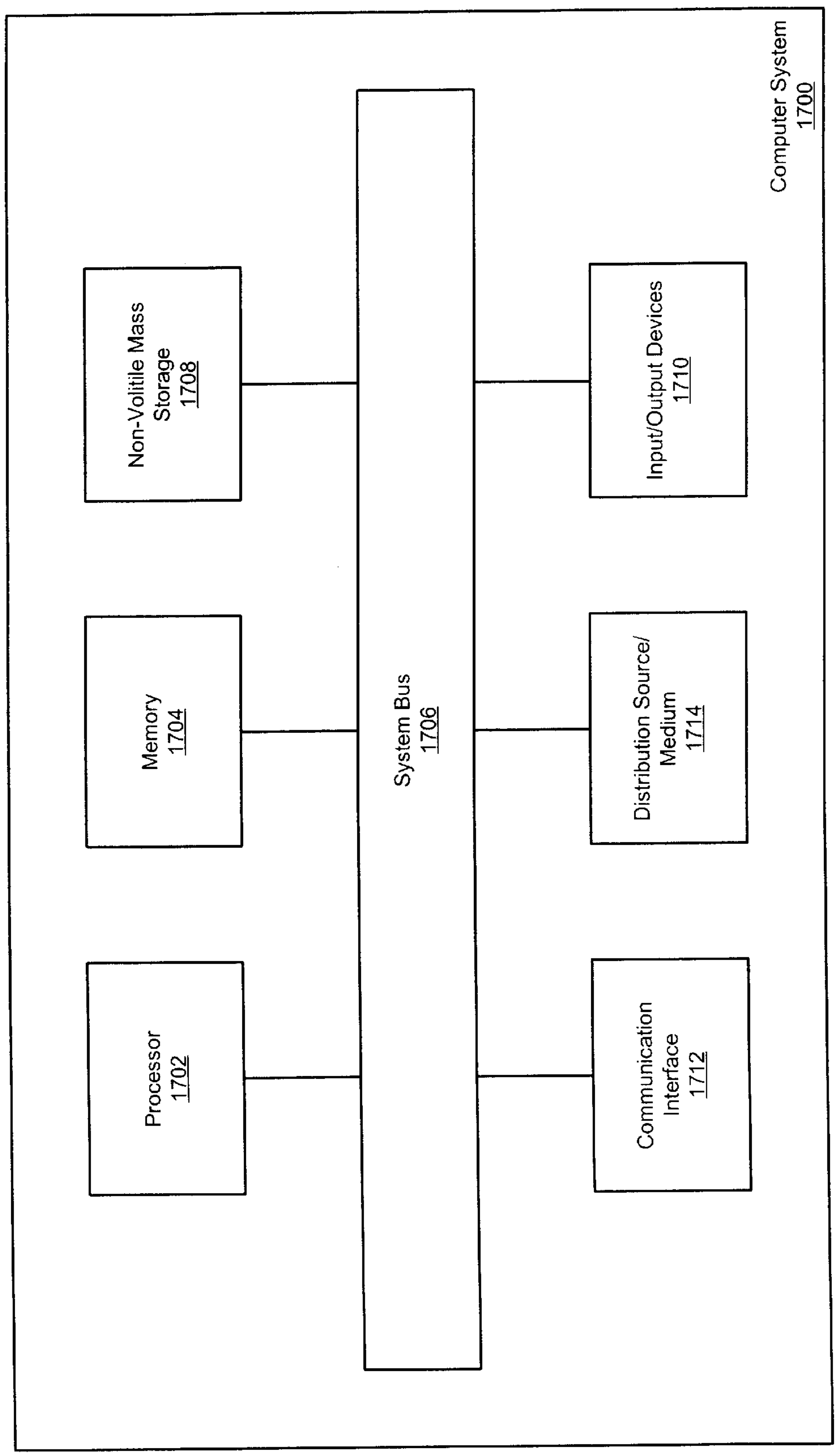
FIG. 17 illustrates one embodiment of a computer system suitable for use to practice the present invention.

FIG. 17 illustrates one embodiment of a computer system suitable for use to practice the present invention. As shown, computer system 1700 includes processor 1702 and memory 1704 coupled to each other via system bus 1706. Coupled to system bus 1706 are non-volatile mass storage 1708, such as hard disks, floppy disk, and so forth, input/output devices 1710, such as keyboard, displays, and so forth, and communication interfaces 1712, such as modem, LAN interfaces, and so forth. Each of these elements perform its conventional functions known in the art.

In particular, system memory 1704 and non-volatile mass storage 1708 are employed to store a working copy and a permanent copy of the programming instructions implementing the above described teachings of the present invention. System memory 1704 and non-volatile mass storage 1706 may also be employed to store the IC designs. The permanent copy of the programming instructions to practice the present invention may be loaded into non-volatile mass storage 1708 in the factory, or in the field, using distribution source/medium 1714 and optionally, communication interfaces 1712. Examples of distribution medium 1714 include recordable medium such as tapes, CDROM, DVD, and so forth. In one embodiment, the programming instructions are part of a collection of programming instructions implementing EDA tool 1600 of FIG. 16. The constitution of elements 1702–1714 are well known, and accordingly will not be further described.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A method comprising:

analyzing a layout of an integrated device layer to identify one or more predetermined structures;

modifying one or more reticle layouts corresponding to the integrated device layer in a predetermined manner for the identified predetermined structures by adding assist features to layout elements having dimensions less than or equal to a predetermined threshold and further wherein at least one of the assist features comprises a hammer head structure to one or more line ends; and performing model-based correction on the modified reticle layouts.

2. The method of claim 1 wherein modifying one or more reticle layouts corresponding to the integrated device layer in a predetermined manner further comprises adding a serif structure to one or more line corners.

3. The method of claim 1 wherein performing model-based correction comprises:

(a) mapping one or more fragments of multiple reticle layouts to a target layout representing a desired integrated device layer;

(b) comparing the target layout to a predicted layer of an integrated device to be manufactured;

(c) determining an error metric for one or more fragments based, at least in part, on the comparison of the simulated layer and the target layout; and (d) modifying placement of one or more fragments of the multiple reticle layouts based, at least in part, on the error metric of the corresponding fragment of the target layer.

4. The method of claim 3 wherein the error metric comprises an edge placement error.

5. The method of claim 3 wherein each fragment of the multiple reticles is mapped to a corresponding fragment of the simulated layer and further wherein multiple reticle layout fragments can be mapped to a single simulated layer fragment.

6. The method of claim 3 wherein (b) through (d) are repeated until each error metric is less than a predetermined threshold.

7. The method of claim 3 herein the multiple reticles are to be used for phase shifting manufacturing techniques.

8. The method of claim 1 wherein the integrated device is an integrated circuit.

9. A machine-readable medium having stored thereon sequences of instructions that, when executed, cause one or more electronic systems to:

analyze a layout of an integrated device layer to identify one or more predetermined structures;

modify one or more reticle layouts corresponding to the integrated device layer in a predetermined manner for the identified predetermined structures by adding assist features to layout elements having dimensions less than or equal to a predetermined threshold and further wherein at least one of the assist features comprises a hammer head structure to one or more line ends; and perform model-based correction on the modified reticle layouts.

10. The machine-readable medium of claim 9 wherein the sequences of instructions that cause the one or more electronic systems to modify one or more reticle layouts corresponding to the integrated device layer in a predetermined manner comprises sequences of instructions that, when executed, cause the one or more electronic systems to add a serif structure to one or more line corners.

11. The machine-readable medium of claim 9 wherein the sequences of instructions that cause the one or more electronic devices to perform model-based correction comprises sequences of instructions that, when executed, cause the one or more electronic systems to:

(a) map one or more fragments of multiple reticle layouts to a target layout representing a desired integrated device layer;

(b) compare the target layout to a predicted layer of an integrated device to be manufactured;

(c) determine an error metric for one or more fragments based, at least in part, on the comparison of the simulated layer and the target layout; and (d) modify placement of one or more fragments of the multiple reticle layouts based, at least in part, on the error metric of the corresponding fragment of the target layer.

12. The machine-readable medium of claim 11 wherein the error metric comprises an edge placement error.

13. The machine-readable medium of claim 11 wherein each fragment of the multiple reticles is mapped to a corresponding fragment of the simulated layer and further wherein multiple reticle layout fragments can be mapped to a single simulated layer fragment.

14. The machine-readable medium of claim 11 wherein (b) through (d) are repeated until each edge placement error is less than a predetermined threshold.

15. The machine-readable medium of claim 11 wherein the multiple reticles are to be used for phase shifting manufacturing techniques.

16. The machine-readable medium of claim 11 wherein the integrated device is an integrated circuit.

17. A computer data signal embodied in a data communications medium shared among a plurality of network devices comprising sequences of instructions that, when executed, cause one or more electronic systems to:

analyze a layout of an integrated device layer to identify one or more predetermined structures;

modify one or more reticle layouts corresponding to the integrated device layer in a predetermined manner for the identified predetermined structures by adding assist features to layout elements having dimensions less than or equal to a predetermined threshold and further wherein at least one of the assist features comprises a hammer head structure to one or more line ends; and perform model-based correction on the modified reticle layouts.

18. The computer data signal of claim 17 wherein the sequences of instructions that cause the one or more electronic systems to modify one or more reticle layouts corresponding to the integrated device layer in a predetermined manner comprises sequences of instructions that, when executed, cause the one or more electronic systems to add a serif structure to one or more line corners.

19. The computer data signal of claim 17 wherein the sequences of instructions that cause the one or more electronic devices to perform model-based correction comprises sequences of instructions that, when executed, cause the one or more electronic systems to:

(a) map one or more fragments of multiple reticle layouts to a target layout representing a desired integrated device layer;

(b) compare the target layout to a predicted layer of an integrated device to be manufactured;

(c) determine an error metric for one or more fragments based, at least in part, on the comparison of the simulated layer and the target layout; and (d) modify placement of one or more fragments of the multiple reticle layouts based, at least in part, on the error metric of the corresponding fragment of the target layer.

20. The computer data signal of claim 19 wherein the error metric comprises an edge placement error.

21. The computer data signal of claim 19 wherein each fragment of the multiple reticles is mapped to a corresponding fragment of the simulated layer and further wherein multiple reticle layout fragments can be mapped to a single simulated layer fragment.

22. The computer data signal of claim 19 wherein (b) through (d) are repeated until each edge placement error is less than a predetermined threshold.

23. The computer data signal of claim 19 wherein the multiple reticles are to be used for phase shifting manufacturing techniques.

24. The computer data signal of claim 19 wherein the integrated device is an integrated circuit.

* * * * *